(12) United States Patent
Chen

(10) Patent No.: US 10,734,540 B1
(45) Date of Patent: Aug. 4, 2020

(54) OPTICAL DEVICE AND METHOD FOR MANUFACTURING THE SAME

(71) Applicant: Advanced Semiconductor Engineering, Inc., Kaohsiung (TW)

(72) Inventor: Jenchun Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/503,321

(22) Filed: Jul. 3, 2019

(51) Int. Cl.
| | | |
|---|---|---|
| *H01L 31/00* | (2006.01) | |
| *H01L 33/00* | (2010.01) | |
| *H01L 31/14* | (2006.01) | |
| *H01L 31/0216* | (2014.01) | |
| *H01L 33/52* | (2010.01) | |
| *H01L 31/18* | (2006.01) | |
| *H01L 33/44* | (2010.01) | |
| *H01L 31/0203* | (2014.01) | |

(52) U.S. Cl.
CPC ........ *H01L 31/143* (2013.01); *H01L 31/0203* (2013.01); *H01L 31/02164* (2013.01); *H01L 31/18* (2013.01); *H01L 33/44* (2013.01); *H01L 33/52* (2013.01)

(58) Field of Classification Search
CPC .............. H01L 31/143; H01L 31/0203; H01L 31/02164; H01L 31/18; H01L 33/44; H01L 33/52; H01L 33/56; H01L 33/483
See application file for complete search history.

(56) References Cited

U.S. PATENT DOCUMENTS

| | | | |
|---|---|---|---|
| 7,105,830 B2* | 9/2006 | Nagano | G01T 1/2018 250/370.11 |
| 8,716,722 B2* | 5/2014 | Peng | H01L 23/31 257/82 |
| 2004/0178350 A1* | 9/2004 | Nagano | G01T 1/2018 250/370.11 |

* cited by examiner

*Primary Examiner* — Nikolay K Yushin
(74) *Attorney, Agent, or Firm* — Foley & Lardner LLP

(57) ABSTRACT

An optical device includes a substrate, a light receiving component, an encapsulant, a coupling layer and a light shielding layer. The light receiving component is disposed on the substrate. The encapsulant covers the light receiving component. The coupling layer is disposed on at least a portion of the encapsulant. The light shielding layer is disposed on the coupling layer.

21 Claims, 12 Drawing Sheets

OPTICAL DEVICE AND METHOD FOR MANUFACTURING THE SAME

BACKGROUND

1. Field of the Disclosure

The present disclosure relates to an optical device and a manufacturing method, and to an optical device including a light shielding layer, and a method for manufacturing the optical device.

2. Description of the Related Art

An optical device may include an emitter, a detector and a clear molding compound. The clear molding compound covers the emitter and the detector. The emitter is used for emitting a light beam. The light beam is reflected by an object, and then detected by the detector. However, a portion of the light beam from the emitter may enter the detector directly, which results in cross-talk between the emitter and the detector. Such cross-talk reduces a sensitivity of the detector.

SUMMARY

In some embodiments, an optical device includes a substrate, a light receiving component, an encapsulant, a coupling layer and a light shielding layer. The light receiving component is disposed on the substrate. The encapsulant covers the light receiving component. The coupling layer is disposed on at least a portion of the encapsulant. The light shielding layer is disposed on the coupling layer.

In some embodiments, an optical device includes a substrate, a light receiving component, a first encapsulant, a light shielding layer and an outer encapsulant. The light receiving component is disposed on the substrate. The first encapsulant covers the light receiving component. The light shielding layer is disposed on the first encapsulant. The outer encapsulant covers the light shielding layer.

In some embodiments, a method for manufacturing an optical device includes: (a) providing a substrate; (b) disposing a light receiving component on the substrate; (c) forming an encapsulant to cover the light receiving component; (d) coating a coupling agent on a surface of the encapsulant to form a coupling layer; and (e) forming a light shielding layer on the coupling layer.

In some embodiments, an optical device includes a substrate, a light receiving component, an encapsulant and a light shielding layer. The light receiving component is disposed on the substrate. The encapsulant covers the light receiving component. The light shielding layer is disposed on the encapsulant. An adhesion of the light shielding layer to the encapsulant is rated as 5B according to ASTM D3359 Test Method B.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
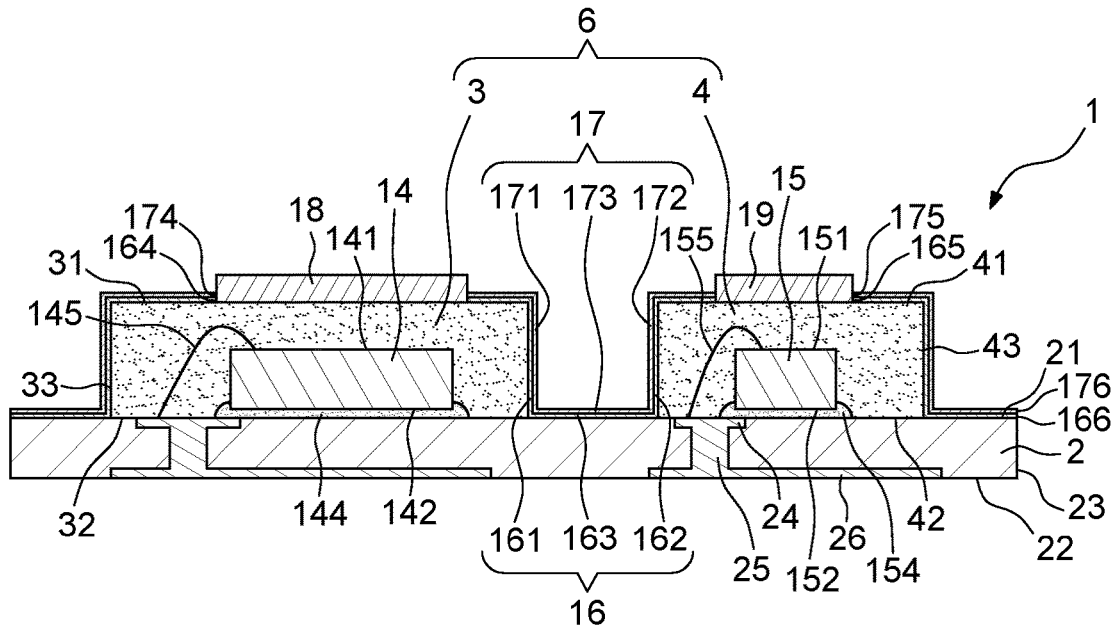
FIG. 1 illustrates a cross sectional view of an example of an optical device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative optical device, a light emitting component and a light receiving component are disposed on a substrate. In order to prevent the cross-talk between the light emitting component and the light receiving component, a shielding structure may be disposed on the substrate to cover the light emitting component and the light receiving component, thus preventing undesired light from reaching the light receiving component. For example, the shielding structure may define a first cavity to accommodate the light emitting component, and a second cavity to accommodate the light receiving component. The shielding structure may be manufactured by injection molding. However, when the size of the shielding structure decreases due to the demand for miniaturization of the optical device, the yield rate of the shielding structure decreases dramatically.

In a comparative optical device, an opaque molding compound is used to replace the shielding structure. For example, two clear molding compounds may be formed on the substrate to respectively cover the light emitting component and the light receiving component. Then, the opaque molding compound may be formed to cover the clear molding compounds. The light emitting component and the light receiving component may thus be shielded by the opaque molding compound. However, an optical density (OD) through the opaque molding compound can reach up to about 3 (OD 3) or less, which cannot meet the industrial specification.

Hence, at least some embodiments of the present disclosure provide for an optical device, which includes a light shielding layer securely adhered on an encapsulant. At least some embodiments of the present disclosure further provide for a method for manufacturing the optical device.

FIG. 1 illustrates a cross sectional view of an optical device 1 according to some embodiments of the present disclosure. The optical device 1 may include a substrate 2, a light receiving component 14, a light emitting component 15, an encapsulant 6 (e.g., including a first encapsulant 3 and a second encapsulant 4), a coupling layer 16, a light shielding layer 17, a first optical lens 18 and a second optical lens 19.

The substrate 2 has a first surface 21, a second surface 22 opposite to the first surface 21, and a lateral surface 23 extending between the first surface 21 and the second surface 22. The substrate 2 may be an embedded trace substrate. For example, the substrate 2 may include a first circuit layer 24 exposed from the first surface 21, a second circuit layer 26 exposed from the second surface 22, and a conductive via 25 electrically connecting the first circuit layer 24 and the second circuit layer 26. In some embodiments, the substrate 2 may further include a semiconductor chip (not shown) disposed between the first surface 21 and the second surface 22 (e.g., the semiconductor chip may be embedded in the substrate 2), and electrically connected to the first circuit layer 24 and/or the second circuit layer 26.

The light receiving component 14 has a first surface 141 and a second surface 142 opposite to the first surface 141. The light receiving component 14 is disposed on and attached to the substrate 2. For example, the second surface 142 of the light receiving component 14 is attached to the first surface 21 of the substrate 2 through an adhesive 144. The light receiving component 14 may be electrically connected to the first circuit layer 24 of the substrate 2 through a bonding wire 145. The light receiving component 14 has a light receiving area, which may include at least a portion of the first surface 141 thereof. The light receiving element 14 may be a component which is able to receiving and/or detecting light reaching the light receiving area, such as a photodiode.

The light emitting component 15 has a first surface 151 and a second surface 152 opposite to the first surface 151. The light emitting component 15 is disposed on and attached to the substrate 2. For example, the second surface 152 of the light emitting component 15 is attached to the first surface 21 of the substrate 2 through an adhesive 154. The light emitting component 15 may be electrically connected to the first circuit layer 24 of the substrate 2 through a bonding wire 155. The light emitting component 15 has a light emitting area, which may include at least a portion of the first surface 151 thereof. The light emitting component 15 may be a component which is able to emit light of a single wavelength or a range of wavelengths, such as a laser diode or a vertical cavity surface-emitting laser (VCSEL). Vertical cavity surface-emitting laser (VCSEL) is a laser diode with single-chip laser resonance function, which mainly emits light in a vertical direction perpendicular to the first surface 151. Compared with traditional edge emitting laser (EEL), VCSEL has the advantages in compatibility with circuit and inspection instruments, reliability, expandability, economy, and packaging function. Since the face recognition technology supported by VCSEL is introduced into smart phone, the demand for the VCSEL is increasing in the industry.

As shown in FIG. 1, the encapsulant 6 in the optical device 1 includes a first encapsulant 3 covering the light receiving component 14, and a second encapsulant 4 covering the light emitting component 15. For example, the first encapsulant 3 may be disposed on the first surface 21 of the substrate 2 and encapsulates the light receiving component 14. The first encapsulant 3 has a first surface 31, a second surface 32 opposite to the first surface 31, and a lateral surface 33 extending between the first surface 31 and the second surface 32. The second surface 32 is disposed on and contacts the first surface 21 of the substrate 2. The first encapsulant 3 may be an encapsulant which allows light to pass therethrough. That is, the first encapsulant 3 may be transparent or translucent. For example, the first encapsulant 3 may be made of a clear epoxy molding compound without fillers.

The second encapsulant 4 may be disposed on the first surface 21 of the substrate 2 and encapsulates the light emitting component 15. The second encapsulant 4 has a first surface 41, a second surface 42 opposite to the first surface 41, and a lateral surface 43 extending between the first surface 41 and the second surface 42. The second surface 42 is disposed on and contacts the first surface 21 of the substrate 2. The second encapsulant 4 may be an encapsulant which allows light to pass therethrough. That is, the second encapsulant 4 may be transparent or translucent. For example, the second encapsulant 4 may be made of a clear epoxy molding compound without fillers. A material of the first encapsulant 3 may be the same as or different from a material of the second encapsulant 4.

The coupling layer 16 is disposed on at least a portion of the encapsulant 6, such as disposed on the first encapsulant 3 and the second encapsulant 4. As shown in FIG. 1, the coupling layer 16 includes a first portion 161, a second portion 162 and a third portion 163. The first portion 161 is disposed on and contacts the first encapsulant 3, such as disposed on and contacting the top surface (e.g., the first surface 31) and the lateral surface 33 of the first encapsulant 3. The second portion 162 is disposed and contacts the second encapsulant 4, such as disposed on and contacting the top surface (e.g., the first surface 41) and the lateral surface 43 of the second encapsulant 4. The third portion 163 is disposed on and contacts the first surface 21 of the substrate 2 and connects the first portion 161 and the second portion 162. The coupling layer 16, such as the first portion 161 thereof, may define a first through hole 164 corresponding to a light receiving area of the light receiving component 14. Similarly, the coupling layer 16, such as the second portion 162 thereof, may define a second through hole 165 corresponding to a light emitting area of the light emitting component 15. However, in some embodiments, if the coupling layer 16 is transparent or translucent, the first through hole 164 and the second through hole 165 may be omitted, and the coupling layer 16 may thus completely cover the first surface 31 of the first encapsulant 3 and/or the first surface 41 of the second encapsulant 4.

The light shielding layer 17 is disposed on and contacts the coupling layer 16. In some embodiments, the light shielding layer 17 may be conformal with the coupling layer 16. As shown in FIG. 1, the light shielding layer 17 also includes a first portion 171, a second portion 172 and a third portion 173 respectively disposed on the first portion 161, the second portion 162 and the third portion of 163 the coupling layer 16. The light shielding layer 17, such as the first portion 171 thereof, defines a first through hole 174 corresponding to a light receiving area of the light receiving component 14. Similarly, the light shielding layer 17, such as the second portion 172 thereof, defines a second through hole 175 corresponding to a light emitting area of the light emitting component 15. The first through hole 174 of the light shielding layer 17 may align with the first through hole 164 of the coupling layer 16, and the second through hole 175 of the light shielding layer 17 may align with the second through hole 165 of the coupling layer 16. A lateral surface 166 of the coupling layer 16, a lateral surface 176 of the light shielding layer 17 and the lateral surface 23 of the substrate 2 may be substantially coplanar. In some embodiments, the third portion 163 of the coupling layer 16 and the third portion 173 of the light shielding layer 17 may be omitted.

The light shielding layer 17 may be made of a material which does not transmit light. For example, an optical density through the light shielding layer 17 at a given wavelength may be greater than 4 (OD 4), and preferably around 5 (OD 5) or greater. That is, the transmittance of the light shielding layer 17 at a given wavelength may be less than $10^{-4}$, and preferably around $10^{-5}$ or less. In some embodiments, the light shielding layer 17 may be a metal layer, such as including stainless steel and/or copper. Said stainless steel may be of any grade, such as grade 306, grade 316, grade 314, etc. For example, the shielding layer 17 may be a single layer of stainless steel having a thickness of 1 μm (SUS 1 μm), a single layer stainless steel having a thickness of 2 μm (SUS 2 μm), three layers respectively of stainless steel/copper/stainless steel having a total thickness of 1 μm (SUS/Cu/SUS 1 μm), or three layers respectively of stainless steel/copper/stainless steel having a total thickness of 2 μm (SUS/Cu/SUS 2 μm). The aforementioned materials are respectively coated (by sputtering) on a SUMIKON® EME-G311L compound having a thickness of 150 μm (150 μm G311L), and the optical density (OD) values thereof are measured at given wavelengths and recorded as Table 1 below.

TABLE 1 optical density (OD) values measured at given wavelengths of light passing through different shielding layers

| light shielding layer | Wavelength | | | |
| --- | --- | --- | --- | --- |
| | 300-700 nm | 700-900 nm | 900-1000 nm | 1000-1100 nm |
| SUS 1 μm | 5.02 | 4.80 | 4.80 | 5.04 |
| SUS 2 μm | 4.98 | 5.28 | 5.28 | 5.61 |
| SUS/Cu/SUS 1 μm | 4.73 | 4.86 | 4.86 | 5.06 |
| SUS/Cu/SUS 2 μm | 4.87 | 5.28 | 5.25 | 5.50 |
| 150 μm G311L before sputtering | 3.47 | 3.04 | 2.86 | 2.72 |

According to Table 1 above, the light shielding layer 17 made of metal has the optical density values around OD 5 at the wavelengths of 300 nm to 1100 nm. That is, the light shielding layer 17 provides favorable light shielding function to the light receiving component 14 and/or the light emitting component 15.

The coupling layer 16 may be made of a coupling agent which is able to improve the adhesion between two objects contacting two opposite sides of the coupling agent. The coupling agent may be selected based on materials of the two objects. In some embodiments, the coupling agent of the coupling layer 16 may be a silane coupling agent, a titanate coupling agent, an aluminate coupling agent, a phosphate coupling agent, a borate coupling agent, a chrome complex coupling agent, a bimetal coupling agent, an aliphatic acid coupling agent, an aliphatic alcohol coupling agent, an ester coupling agent, etc. For example, the first encapsulant 3 may be made of epoxy, the light shielding layer 17 may be made of stainless steel and/or copper, and the coupling agent of the coupling layer 16 may correspondingly be made of the silane coupling agent.

The silane coupling agent may act as a bonding or bridging agent to improve the adhesion between an organic material (e.g., the first encapsulant 3 and/or the second encapsulant 4) and an inorganic material (e.g., the light shielding layer 17). For example, a silane coupling agent may have a formula as below:

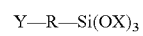

The "Y" group is a reactive group which is able to react with the encapsulant 6 (e.g., the first encapsulant 3 and/or the second encapsulant 4). For example, the "Y" group may be an epoxy group which is able to react with a "COOH" group or a "$NH_2$" group of a molding compound of the first encapsulant 3 and/or the second encapsulant 4. The "R" group may be an alkyl chain connecting the "Y" group and the "$Si(OX)_3$" group. The "$Si(OX)_3$" group may be hydrolyzed to form a "$Si(OH)_3$" group. Then, the "OH" group thereof may go through a hydration condensation reaction to form a chemical bonding with the light shielding layer 17, such as with stainless and/or copper of the light shielding layer 17. In some embodiments, by using the silane coupling agent as the coupling layer 16, the adhesion the light shielding layer 17 to the encapsulant 6 may be improved. In some embodiments, an adhesion of the light shielding layer 17 to the encapsulant 6 may be rated as 5B according to ASTM D3359 Test Method B. Further, one or more layers may be sandwiched between the light shielding layer 17 and the encapsulant 6. For example, as shown in FIG. 1, the coupling layer 16 is sandwiched between the encapsulant 6 and the light shielding layer 17, and thus "the adhesion of the light shielding layer 17 to the encapsulant 6" may be defined as the adhesion of the light shielding layer 17 and the coupling layer 16 to the encapsulant 6. According to ASTM D3359 Test Method B, the light shielding layer 17 (and the coupling layer 16, if applicable) may be cross-cut to form a 10×10 grid of 1 mm×1 mm squares, and a tape may be placed to contact the light shielding layer 17. The tape may be any tape which meets CID AA-113, Type 1, Class B, such as 3M™ Scotch® Transparent Film Tape 600 or 610. After removal of the tape, the adhesion may be rated based on removal of the light shielding layer 17 from the encapsulant 6.

The first optical lens 18 is disposed on the first encapsulant 3, and in the first through hole 164 of the coupling layer 16 and the first through hole 174 of the light shielding layer. The first optical lens 18 may be a lens for focusing light, or an optical filter which selectively transmits light of different wavelengths. The first optical lens 18 may be in a form of a solid or a gel with a high viscosity. In some embodiments, the first optical lens 18 may be an infrared radiation (IR) filter.

The second optical lens 19 is disposed on the second encapsulant 4, and in the second through hole 165 of the coupling layer 16 and the second through hole 175 of the light shielding layer. The second optical lens 19 may be a lens for focusing light, or an optical filter which selectively transmits light of different wavelengths. The second optical lens 19 may be in a form of a solid or a gel with a high viscosity. In some embodiments, the second optical lens 19 may be an infrared radiation (IR) filter.

In the optical device 1, due to the arrangement of the coupling layer 16, the adhesion between the encapsulant 6 (e.g., the first encapsulant 3 and/or the second encapsulant 4) and the light shielding layer 17 (e.g., the first portion 171 and second portion 172) may be improved. Hence, peeling of the light shielding layer 17 from the encapsulant 6 may be avoided. Further, the light shielding effect of the light shielding layer 17 is excellent when the material of the light shielding layer 17 is metal. In addition, the light shielding layer 17 may be formed by coating such as sputtering, thus, the light shielding layer 17 can cover the corners formed by the encapsulant 6 (e.g., the first encapsulant 3 and/or the second encapsulant 4) and the substrate 2 smoothly and continuously. As a result, the light may not pass through such corners.

Figure 2:
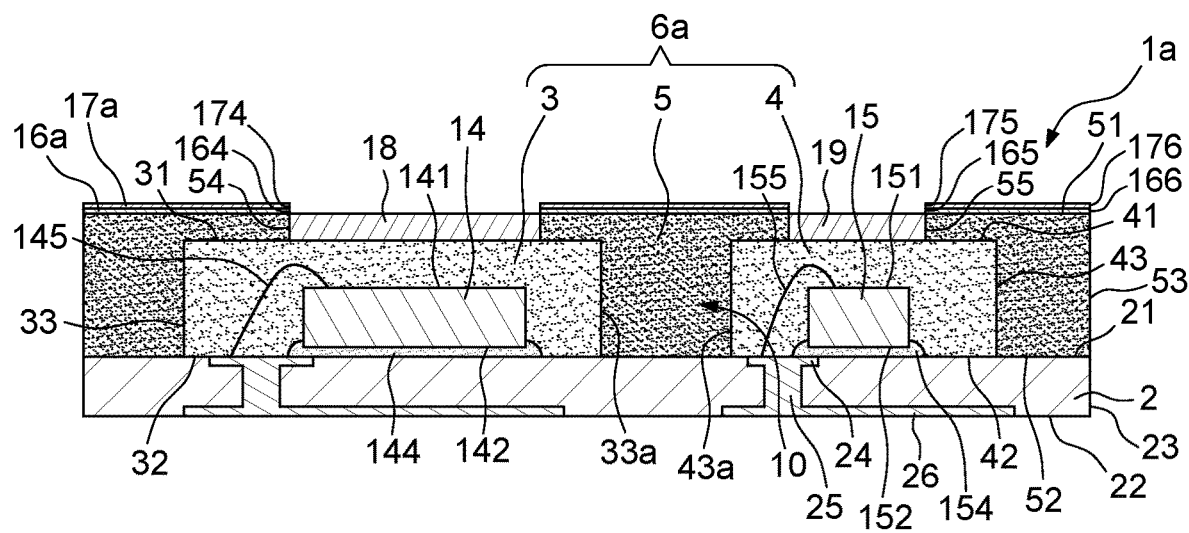
FIG. 2 illustrates a cross sectional view of an example of an optical device according to some embodiments of the present disclosure.

FIG. 2 illustrates a cross sectional view of an example of an optical device 1a according to some embodiments of the present disclosure. The optical device 1a is similar to the optical device 1 shown in FIG. 1, except for the encapsulant 6a (e.g., including a first encapsulant 3, a second encapsulant 4 and an outer encapsulant 5), the coupling layer 16a and the light shielding layer 17a.

As shown in FIG. 2, the encapsulant 6a of the optical device 1a includes a first encapsulant 3, a second encapsulant 4 and an outer encapsulant 5. The first encapsulant 3 and the second encapsulant 4 are similar to those shown in FIG. 1, thus are not redundantly repeated here. The outer encapsulant 5 covers the first encapsulant 3 and the second encapsulant 4. For example, the outer encapsulant 5 is disposed on and contacts a top surface (e.g., the first surface 31) and the lateral surface 33 of the first encapsulant 3, and a top surface (e.g., the first surface 41) and the lateral surface 43 of the second encapsulant 4. The outer encapsulant 5 has a first surface 51, a second surface 52 opposite to the first surface 51, and a lateral surface 53 extending between the first surface 51 and the second surface 52. The second surface 52 is disposed on and contacts the first surface 21 of the substrate 2. The lateral surface 53 is substantially coplanar with the lateral surface 23 of the substrate 2. The outer encapsulant 5 defines a first through hole 54 corresponding to a light receiving area of the light receiving component 14, and a second through hole 55 corresponding to a light emitting area of the light emitting component 15. A trench 10 is defined between the first encapsulant 3 and the second encapsulant 4, and the outer encapsulant 5 is further disposed in the trench 10 between the first encapsulant 3 and the second encapsulant 4. For example, an inner portion 33a of the lateral surface 33 of the first encapsulant 3 faces an inner portion 43a of the lateral surface 43 of the second encapsulant 4. The trench 10 is defined between the inner portion 33a of the lateral surface 33 of the first encapsulant 3 and inner portion 43a of the lateral surface 43 of the second encapsulant 4. The outer encapsulant 5 disposed in the trench 10 may prevent the light from being transmitted from the light emitting component 15 directly to the light receiving component 14.

The outer encapsulant 5 may be made of a material which does not transmit light, and may thus be opaque. In some embodiments, the outer encapsulant 5 may be made of an epoxy molding compound (with or without fillers) including a black pigment, such as carbon black. For example, a material of the outer encapsulant 5 may be SUMIKON® EME-G311L. An optical density of the outer encapsulant 5 with a thickness of about 150 μm at a given wavelength may be greater than 2 (OD2), and preferably greater than 3 (OD 3).

The coupling layer 16a is disposed on and contacts a top surface 51 of the outer encapsulant 5. The coupling layer 16a may define a first through hole 164 corresponding to the light receiving area of the light receiving component 14, and a second through hole 165 corresponding to the light emitting area of the light emitting component 15.

The light shielding layer 17a is disposed on and contacts the coupling layer 16a. A lateral surface 166 of the coupling layer 16a, a lateral surface 176 of the light shielding layer 17a, a lateral surface 53 of the outer encapsulant 5 and a lateral surface 23 of the substrate 2 may be substantially coplanar. Similar to the coupling layer 16a, the light shielding layer 17a may define a first through hole 174 corresponding to the light receiving area of the light receiving component 14, and a second through hole 175 corresponding to the light emitting area of the light emitting component 15. The first through hole 54 of the outer encapsulant 5 may align with the first through hole 174 of the light shielding layer 17a and the first through hole 164 of the coupling layer 16a, and the second through hole 55 of the outer encapsulant 5 may align with the second through hole 175 of the light shielding layer 17a and the second through hole 165 of the coupling layer 16a.

The first optical lens 18 is disposed on the first encapsulant 3, and in the first through hole 54 of the outer encapsulant 5, the first through hole 164 of the coupling layer 16a and the first through hole 174 of the light shielding layer 17a. The second optical lens 19 is disposed on the second encapsulant 4, and in the second through hole 55 of the outer encapsulant 5, the second through hole 165 of the coupling layer 16a and the second through hole 175 of the light shielding layer 17a.

Figure 3:
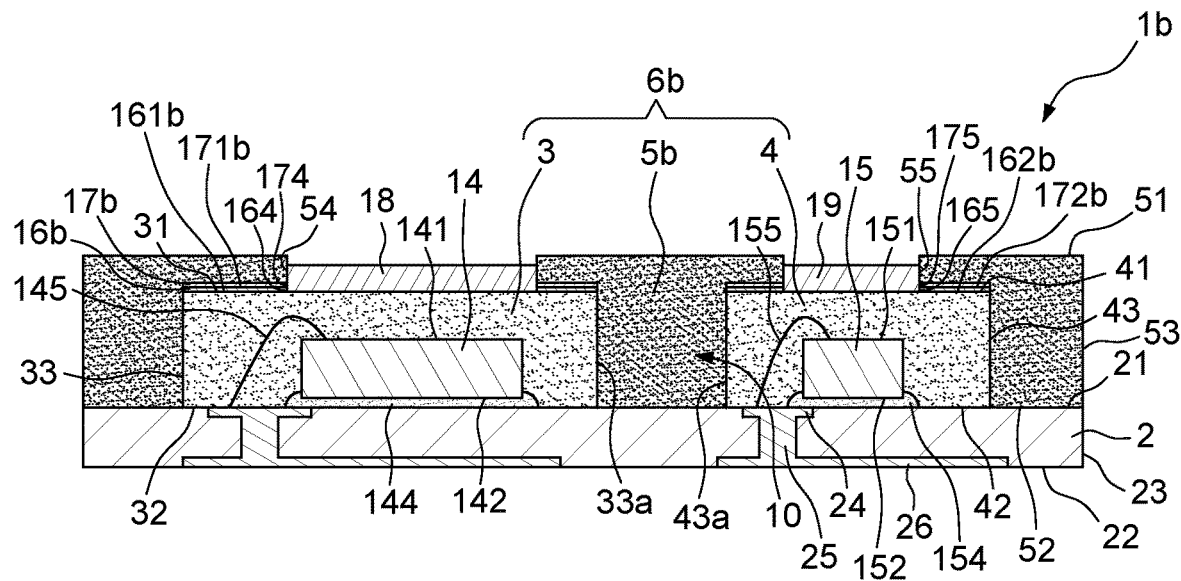
FIG. 3 illustrates a cross sectional view of an example of an optical device according to some embodiments of the present disclosure.

FIG. 3 illustrates a cross sectional view of an example of an optical device 1b according to some embodiments of the present disclosure. The optical device 1b is similar to the optical device 1a shown in FIG. 2, except for the coupling layer 16b and the light shielding layer 17b.

The coupling layer 16b is disposed on and covers at least a portion of the encapsulant 6b. For example, the encapsulant 6b includes the first encapsulant 3, the second encapsulant 4 and an outer encapsulant 5b, and the coupling layer 16b covers the first encapsulant 3 and the second encapsulant 4. As shown in FIG. 3, the coupling layer 16b includes a first portion 161b disposed on and contacts a top surface (e.g., the first surface 31) of the first encapsulant 3, and a second portion 162b disposed on and contacts a top surface (e.g., the first surface 41) of the second encapsulant 4. The first portion 161b and the second portion 162b of the coupling layer 16b may be separated from each other.

The light shielding layer 17b is disposed on and contacts the coupling layer 16b. As shown in FIG. 3, the light shielding layer 17b includes a first portion 171b disposed on and contacts the first portion 161b of the coupling layer 16b, and a second portion 172b disposed on and contacts the second portion 162b of the coupling layer 16b. The first portion 171b and the second portion 172b of the light shielding layer 17b may be separated from each other.

A lateral surface of the first portion 161b of the coupling layer 16b, a lateral surface of the first portion 171b of the light shielding layer 17b and the lateral surface 33 of the first encapsulant 3 are substantially coplanar. Similarly, a lateral surface of the second portion 162b of the coupling layer 16b, a lateral surface of the second portion 171b of the light shielding layer 17b and the lateral surface 43 of the second encapsulant 4 are substantially coplanar. That is, the coupling layer 16b and the light shielding layer 17b are not disposed on the lateral surface 33 of the first encapsulant 3 or the lateral surface 43 of the second encapsulant 4.

The outer encapsulant 5b is disposed on and covers the first encapsulant 3, the second encapsulant 4, the coupling layer 16b and the light shielding layer 17b. As shown in FIG. 3, the outer encapsulant 5b is disposed on and contacts the light shielding layer 17b, the lateral surface 33 of the first encapsulant 3 and the lateral surface 43 of the second encapsulant 4.

Figure 4:
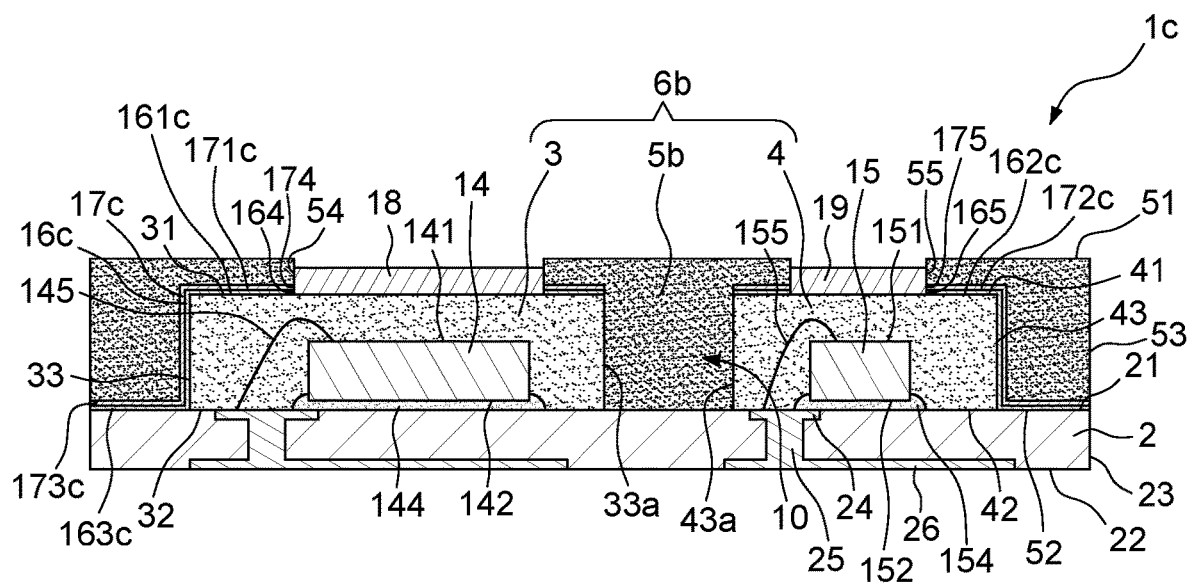
FIG. 4 illustrates a cross sectional view of an example of an optical device according to some embodiments of the present disclosure.

FIG. 4 illustrates a cross sectional view of an example of an optical device 1c according to some embodiments of the present disclosure. The optical device 1c is similar to the optical device 1b shown in FIG. 3, except for the coupling layer 16c and the light shielding layer 17c.

As shown in FIG. 4, the first portion 161c of the coupling layer 16c is further disposed on and contacts the lateral surface 33 of the first encapsulant 3, except for the inner portion 33a of the lateral surface 33. The first portion 171c of the light shielding layer 17c is disposed on the first portion 161c of the coupling layer 16c. Accordingly, the first portion 171c of the light shielding layer 17c is further disposed on the lateral surface 33 of the first encapsulant 3, except for the inner portion 33a of the lateral surface 33.

Similarly, the second portion 162c of the coupling layer 16c is further disposed on and contacts the lateral surface 43 of the second encapsulant 4, except for the inner portion 43a of the lateral surface 43. The second portion 172c of the light shielding layer 17c is disposed on the second portion 162c of the coupling layer 16c. Accordingly, the second portion 172c of the light shielding layer 17c is further disposed on the lateral surface 43 of the second encapsulant 4, except for the inner portion 43a of the lateral surface 43.

The coupling layer 16c further includes a third portion 163c disposed on the first surface 21 of the substrate 2 and connects the first portion 161c and the second portion 162c. Similarly, the light shielding layer 17c further includes a third portion 173c disposed on the third portion 163c of the coupling layer 16c, and connects the first portion 171c and the second portion 172c.

Figure 5:
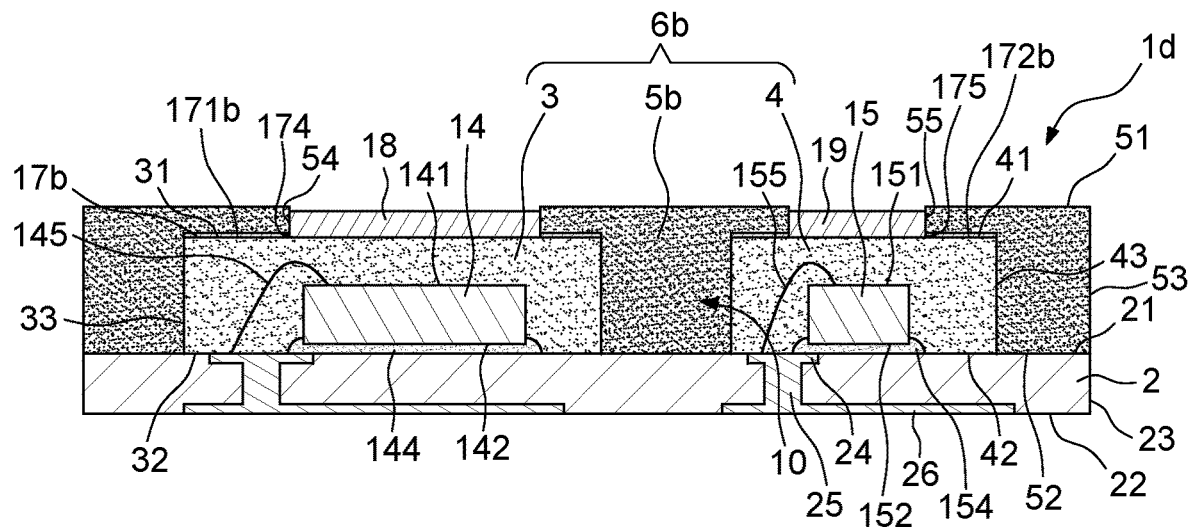
FIG. 5 illustrates a cross sectional view of an example of an optical device according to some embodiments of the present disclosure.

FIG. 5 illustrates a cross sectional view of an example of an optical device 1d according to some embodiments of the present disclosure. The optical device 1d is similar to the optical device 1b shown in FIG. 3, except that the coupling layer 16b is omitted. That is, the light shielding layer 17b (including the first portion 171b and the second portion 172b) is disposed on and contacts the top surface (e.g., the first surface 31) of the first encapsulant 3 and the top surface (e.g., the first surface 41) of the second encapsulant 4.

Since the outer encapsulant 5b is disposed on and covers the light shielding layer 17b, the position of the light shielding layer 17b may be fixed. Besides, the light shielding layer 17b may be protected by the outer encapsulant 5b, and is thus prevented from peeling. In addition, the light shielding layer 17b is interposed or sandwiched between two encapsulants (e.g., between the outer encapsulant 5b and the first encapsulant 3, or between the outer encapsulant 5b and the second encapsulant 4), thus, the coupling layer 16b may be unnecessary.

FIG. 6 through FIG. 12 illustrate a method for manufacturing an optical device according to some embodiments of the present disclosure. In some embodiments, the method is for manufacturing the optical device 1 shown in FIG. 1.

Figure 6:
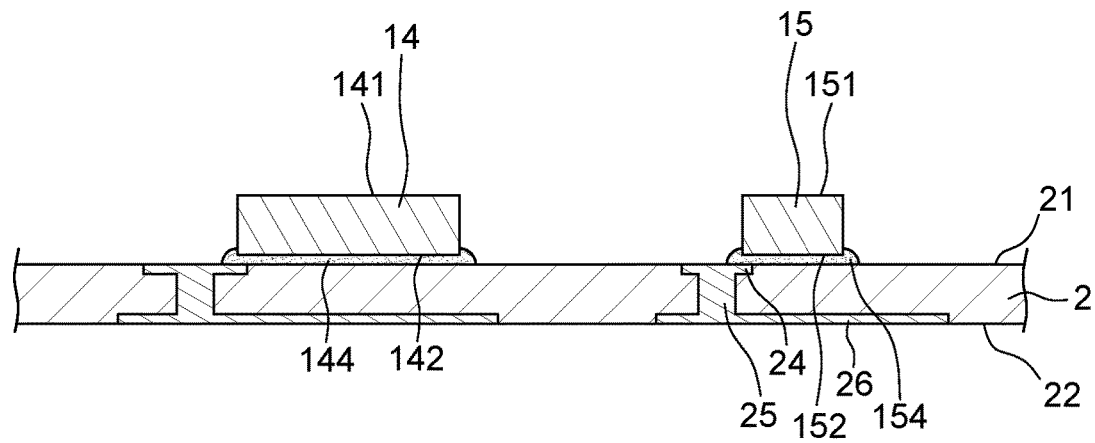
FIG. 6 illustrates one or more stages of an example of a method for manufacturing an optical device according to some embodiments of the present disclosure.

Referring to FIG. 6, a substrate 2 is provided. The substrate 2 has a first surface 21 and a second surface 22 opposite to the first surface 21. The substrate 2 may be an embedded trace substrate. For example, the substrate 2 may include a first circuit layer 24 exposed from the first surface 21, a second circuit layer 26 exposed from the second surface 22, and a conductive via 25 electrically connecting the first circuit layer 24 and the second circuit layer 26.

Then, a light receiving component 14 and a light emitting component 15 are disposed on and attached to the substrate 2 side by side. The light emitting component 15 is adjacent to the light receiving component 14. The light receiving component 14 has a first surface 141 and a second surface 142 opposite to the first surface 141. For example, the second surface 142 of the light receiving component 14 is attached to the first surface 21 of the substrate 2 through an adhesive 144. The light receiving component 14 has a light receiving area, which may include at least a portion of the first surface 141 thereof. The light emitting component 15 has a first surface 151 and a second surface 152 opposite to the first surface 151. For example, the second surface 152 of the light emitting component 15 is attached to the first surface 21 of the substrate 2 through an adhesive 154. The light emitting component 15 has a light emitting area, which may include at least a portion of the first surface 151 thereof.

Figure 7:
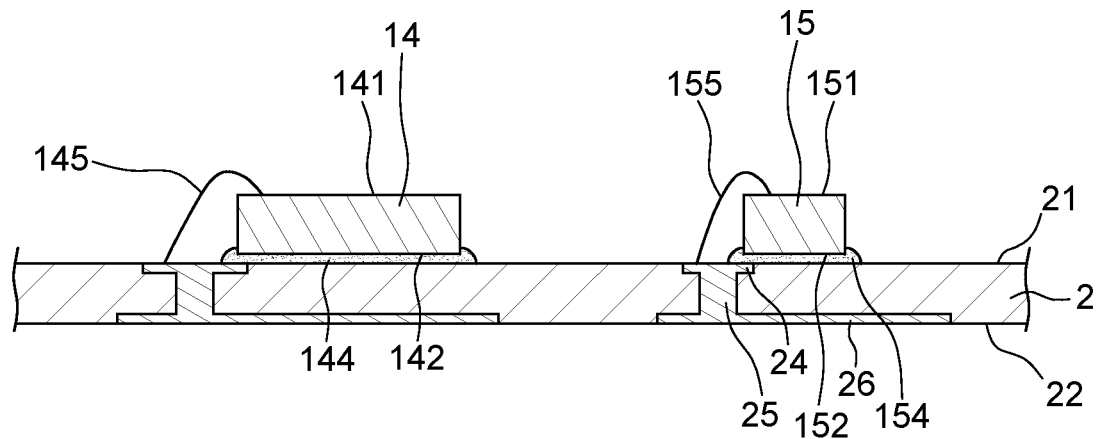
FIG. 7 illustrates one or more stages of an example of a method for manufacturing an optical device according to some embodiments of the present disclosure.

Referring to FIG. 7, the light receiving component 14 and the light emitting component 15 are electrically connected to the substrate 2. For example, a bonding wire 145 is formed to electrically connect the light receiving component 14 to the first circuit layer 24 of the substrate 2. Similarly, a bonding wire 155 is formed to electrically connect the light emitting component 15 to the first circuit layer 24 of the substrate 2.

Figure 8:
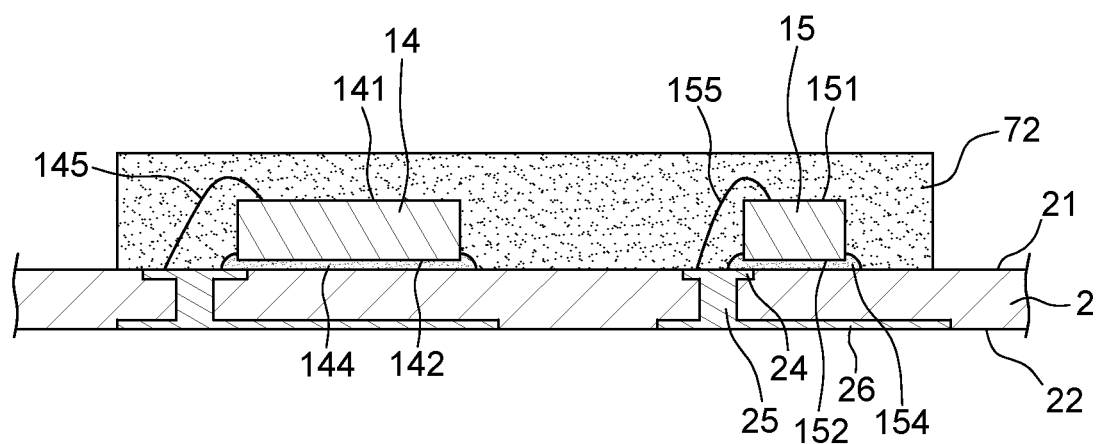
FIG. 8 illustrates one or more stages of an example of a method for manufacturing an optical device according to some embodiments of the present disclosure.

Referring to FIG. 8, an encapsulant 72 is formed on the substrate 2 to cover the light receiving component 14 and the light emitting component 15. The encapsulant 72 may be made of a clear epoxy molding compound without fillers.

Figure 9:
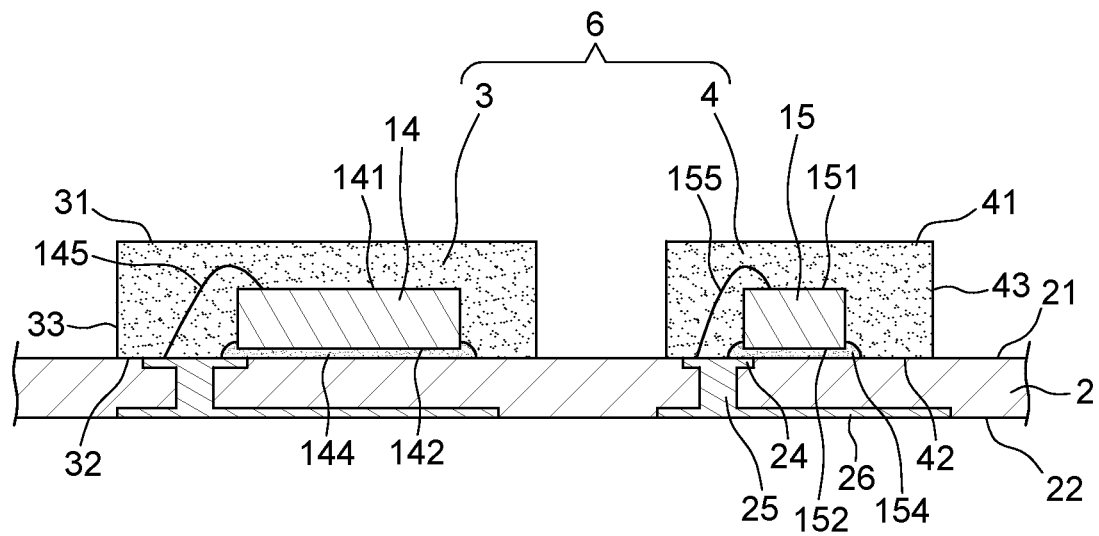
FIG. 9 illustrates one or more stages of an example of a method for manufacturing an optical device according to some embodiments of the present disclosure.

Referring to FIG. 9, the encapsulant 72 is cut and separated, thus forming an encapsulant 6. The encapsulant 6 includes a first encapsulant 3 to cover the light receiving component 14, and a second encapsulant 4 to cover the light emitting component 15. The first encapsulant 3 is disposed on the first surface 21 of the substrate 2 and encapsulates the light receiving component 14. The first encapsulant 3 has a first surface 31, a second surface 32 opposite to the first surface 31, and a lateral surface 33 extending between the first surface 31 and the second surface 32. The second surface 32 is disposed on and contacts the first surface 21 of the substrate 2. The second encapsulant 4 is disposed on the first surface 21 of the substrate 2 and encapsulates the light emitting component 15. The second encapsulant 4 has a first surface 41, a second surface 42 opposite to the first surface 41, and a lateral surface 43 extending between the first surface 41 and the second surface 42. The second surface 42 is disposed on and contacts the first surface 21 of the substrate 2. The first encapsulant 3 and the second encapsulant 4 are separated from each other.

Figure 10:
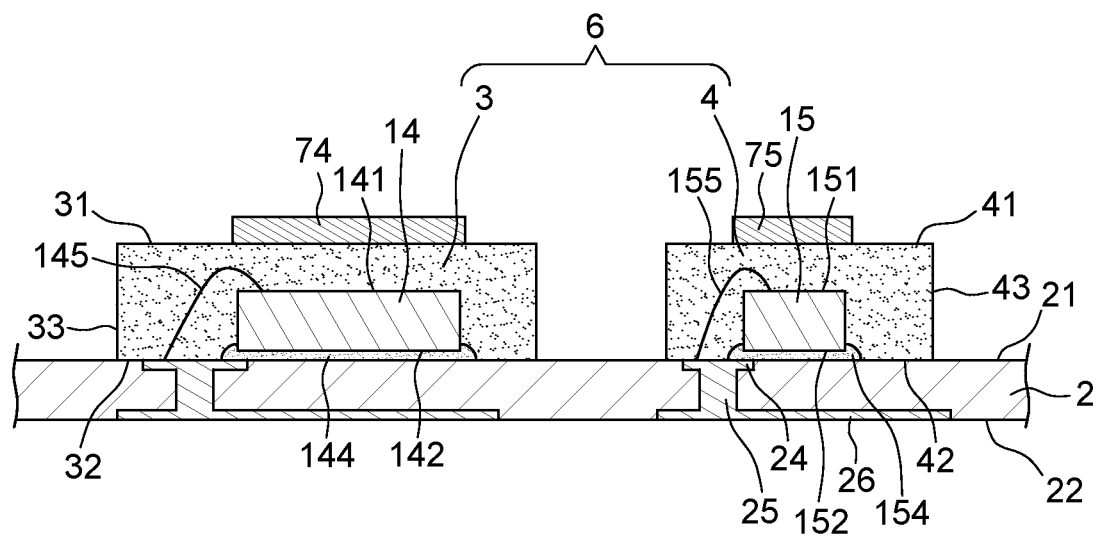
FIG. 10 illustrates one or more stages of an example of a method for manufacturing an optical device according to some embodiments of the present disclosure.

Referring to FIG. 10, a first spacer 74 is disposed on the first encapsulant 3 and corresponding to the light receiving area of the light receiving component 14. Similarly, a second spacer 75 is disposed on the second encapsulant 4 and corresponding to the light emitting area of the light emitting component 15. The first spacer 74 and/or the second spacer 75 may be a tape attached to the encapsulant 6.

Figure 11:
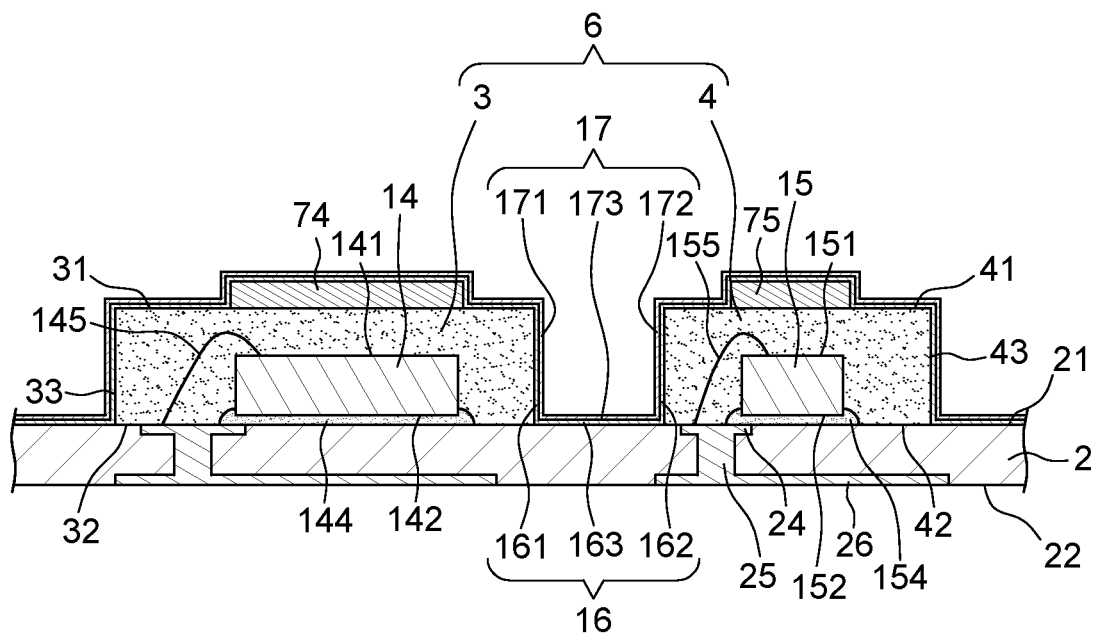
FIG. 11 illustrates one or more stages of an example of a method for manufacturing an optical device according to some embodiments of the present disclosure.

Referring to FIG. 11, a coupling agent is coated on a surface of the encapsulant 6, such as a top surface (e.g., the first surface 31) and the lateral surface 33 of the first encapsulant 3 and a top surface (e.g., the first surface 41) and the lateral surface 43 of the second encapsulant 4, to form a coupling layer 16. As shown in FIG. 11, the coupling agent is coated on the first encapsulant 3, the first spacer 74, the second encapsulant 4, the second spacer 75 and the substrate 2 to form the coupling layer 16. The coupling layer 16 includes a first portion 161, a second portion 162 and a third portion 163. The first portion 161 is disposed on and contacts the first encapsulant 3, such as disposed on and contacting the top surface (e.g., the first surface 31) and the lateral surface 33 of the first encapsulant 3. The second portion 162 is disposed and contacts the second encapsulant 4, such as disposed on and contacting the top surface (e.g., the first surface 41) and the lateral surface 43 of the second encapsulant 4. The third portion 163 is disposed on and contacts the first surface 21 of the substrate 2 and connects the first portion 161 and the second portion 162. In some embodiments, after coating, the coupling agent may further be heated to form the coupling layer 16 bonded to the encapsulant 6. In some embodiments, the coupling agent of the coupling layer 16 may be a silane coupling agent, a titanate coupling agent, an aluminate coupling agent, a phosphate coupling agent, a borate coupling agent, a chrome complex coupling agent, a bimetal coupling agent, an aliphatic acid coupling agent, an aliphatic alcohol coupling agent, an ester coupling agent, etc.

Then, a light shielding layer 17 is formed on and contacts the coupling layer 16 by, for example, sputtering. As shown in FIG. 11, the light shielding layer 17 also includes a first portion 171, a second portion 172 and a third portion 173 respectively disposed on the first portion 161, the second portion 162 and the third portion of 163 the coupling layer 16. In some embodiments, after sputtering, the light shielding layer 17 may further be heated to form bonding with the coupling layer 16. In some embodiments, the light shielding layer 17 may be a metal layer, such as including stainless steel and/or copper.

Figure 12:
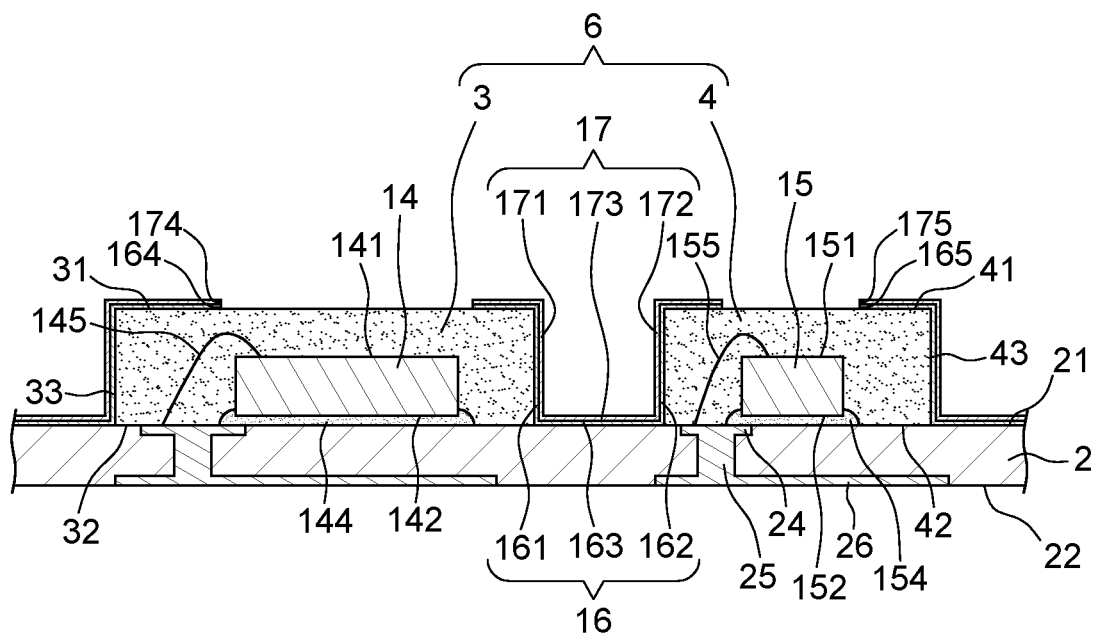
FIG. 12 illustrates one or more stages of an example of a method for manufacturing an optical device according to some embodiments of the present disclosure.

Referring to FIG. 12, the first spacer 74 is removed, such that a portion of the coupling layer 16 and a portion of the light shielding layer 17 on the first spacer 74 are correspondingly removed to form a first through hole 164 of the coupling layer 16 and a first through hole 174 of the light shielding layer 17. Similarly, the second spacer 75 is removed, such that a portion of the coupling layer 16 and a portion of the light shielding layer 17 on the second spacer 75 are correspondingly are removed to form a second through hole 165 of the coupling layer 16 and a second through hole 175 of the light shielding layer 17. That is, the coupling layer 16 defines the first through hole 164 corresponding to the light receiving area of the light receiving component 14, and a second through hole 165 corresponding to the light emitting area of the light emitting component 15. Similarly, the light shielding layer 17 defines the first through hole 174 corresponding to the light receiving area of the light receiving component 14, and a second through hole 175 corresponding to the light emitting area of the light emitting component 15. The first through hole 174 of the light shielding layer 17 may align with the first through hole 164 of the coupling layer 16, and the second through hole 175 of the light shielding layer 17 may align with the second through hole 165 of the coupling layer 16.

Then, a first optical lens 18 is disposed on the first encapsulant 3, and in the first through hole 164 of the coupling layer 16 and the first through hole 174 of the light shielding layer 17. Similarly, a second optical lens 19 is disposed on the second encapsulant 4, and in the second through hole 165 of the coupling layer 16 and the second through hole 175 of the light shielding layer 17. Then, a singulation process is conducted, thus forming the optical device 1 as shown in FIG. 1. Accordingly, a lateral surface 166 of the coupling layer 16, a lateral surface 176 of the light shielding layer 17 and a lateral surface 23 of the substrate 2 may be substantially coplanar.

Figure 13:
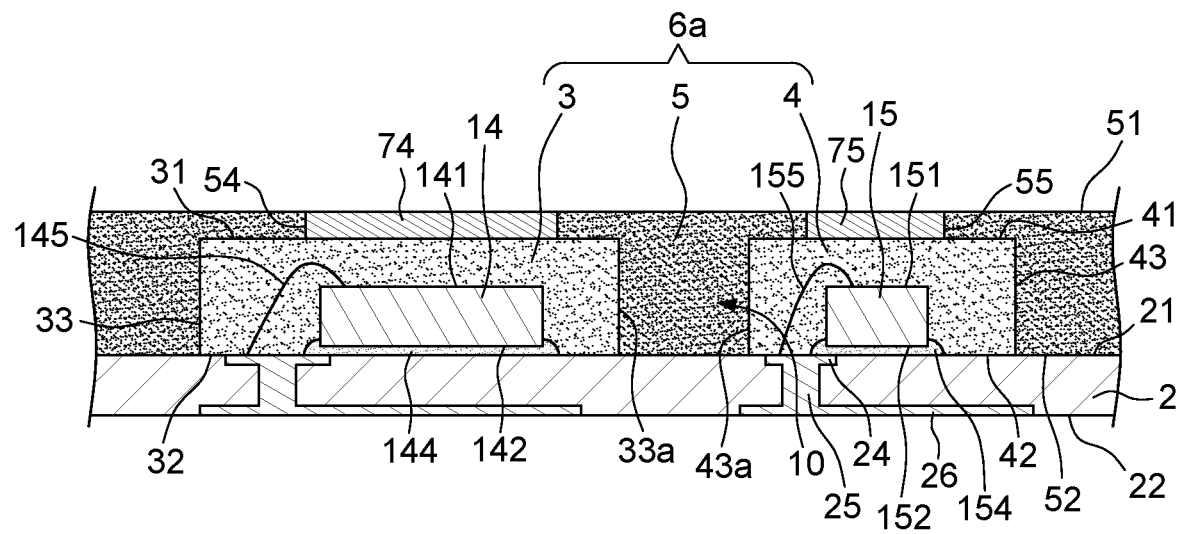
FIG. 13 illustrates one or more stages of an example of a method for manufacturing an optical device according to some embodiments of the present disclosure.
Figure 14:
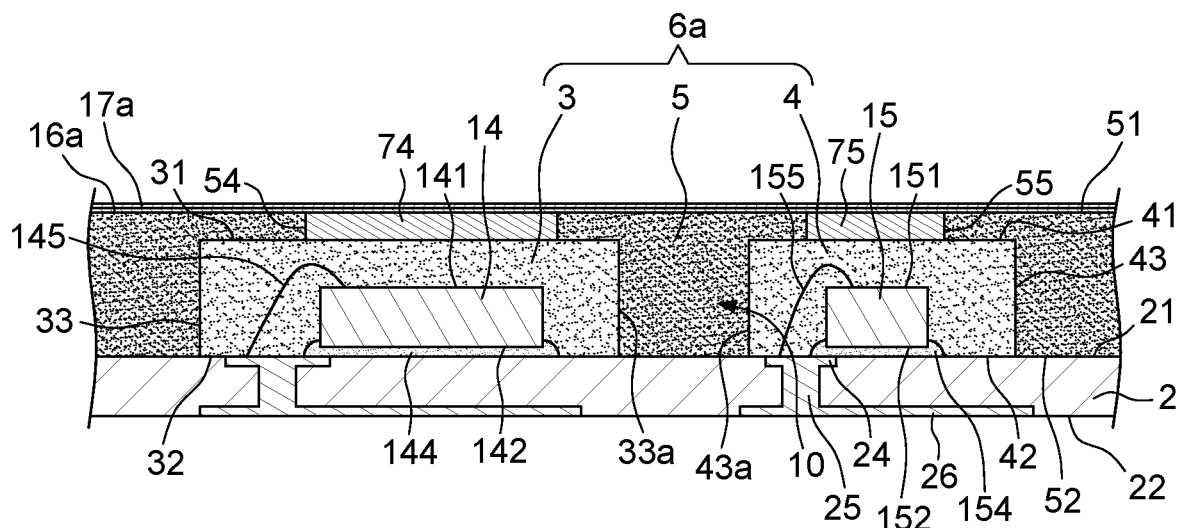
FIG. 14 illustrates one or more stages of an example of a method for manufacturing an optical device according to some embodiments of the present disclosure.
Figure 15:
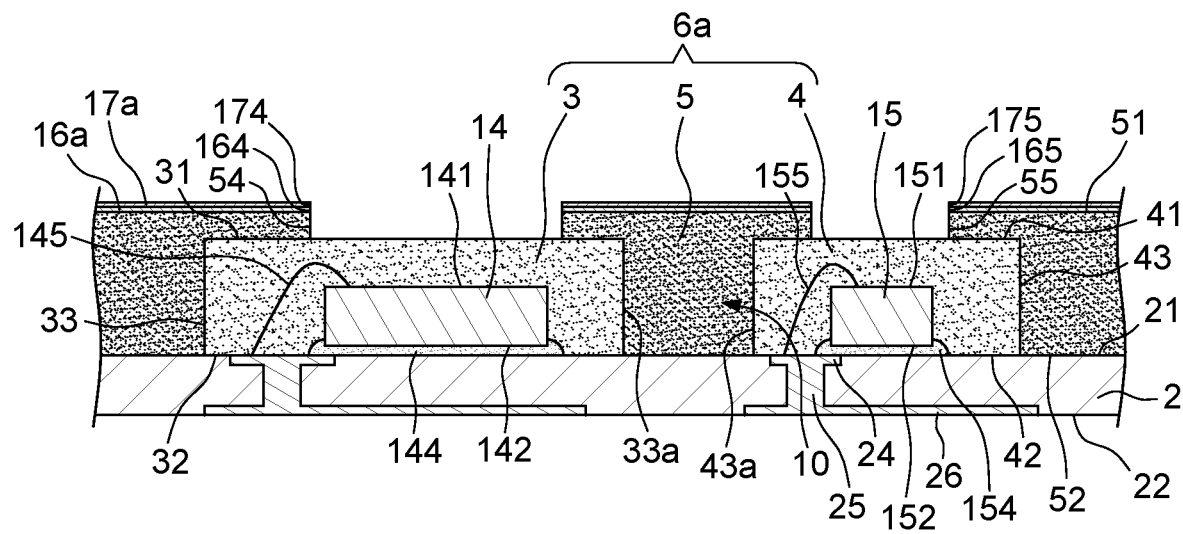
FIG. 15 illustrates one or more stages of an example of a method for manufacturing an optical device according to some embodiments of the present disclosure.

FIGS. 13 to 15 illustrate a method for manufacturing an optical device according to some embodiments of the present disclosure. In some embodiments, the method is for manufacturing an optical device such as the optical device 1a shown in FIG. 2. The initial stages of the illustrated process are the same as, or similar to, the stages illustrated in FIGS. 6 to 10. FIG. 13 depicts a stage subsequent to that depicted in FIG. 10.

Referring to FIG. 13, an outer encapsulant 5 is formed to cover the first encapsulant 3 and the second encapsulant 4. The outer encapsulant 5 covers the first encapsulant 3 and the second encapsulant 4. For example, the outer encapsulant 5 is disposed on and contacts a top surface (e.g., the first surface 31) and the lateral surface 33 of the first encapsulant 3, and a top surface (e.g., the first surface 41) and the lateral surface 43 of the second encapsulant 4. The outer encapsulant 5 has a first surface 51 and a second surface 52 opposite to the first surface 51. The second surface 52 is disposed on and contacts the first surface 21 of the substrate 2. A trench 10 is defined between the first encapsulant 3 and the second encapsulant 4, and the outer encapsulant 5 is further disposed in the trench 10 between the first encapsulant 3 and the second encapsulant 4. For example, an inner portion 33a of the lateral surface 33 of the first encapsulant 3 faces an inner portion 43a of the lateral surface 43 of the second encapsulant 4. The trench 10 is defined between the inner portion 33a of the lateral surface 33 of the first encapsulant 3 and inner portion 43a of the lateral surface 43 of the second encapsulant 4. The outer encapsulant 5 defines a first through hole 54 to accommodate the first spacer 74, and a second through hole 55 to accommodate the second spacer 75. The first through hole 54 corresponds to the light receiving area of the light receiving component 14, and the second through hole 55 corresponds to the light emitting area of the light emitting component 15. Hence, an encapsulant 6a is formed and includes the first encapsulant 3, the second encapsulant 4 and the outer encapsulant 5.

Referring to FIG. 14, a coupling agent is coated on a surface of the encapsulant 6a, such as a top surface (e.g., the first surface 51) of the outer encapsulant 5, to form a coupling layer 16a. Then, a light shielding layer 17a is formed on and contacts the coupling layer 16a.

Referring to FIG. 15, the first spacer 74 is removed. A portion of the coupling layer 16a and a portion of the light shielding layer 17a on the first spacer 74 are correspondingly removed to form a first through hole 164 of the coupling layer 16a and a first through hole 174 of the light shielding layer 17a. Similarly, the second spacer 75 is removed, and a portion of the coupling layer 16a and a portion of the light shielding layer 17a on the second spacer 75 are correspondingly removed to form a second through hole 165 of the coupling layer 16a and a second through hole 175 of the light shielding layer 17a. That is, the coupling layer 16a defines the first through hole 164 corresponding to the light receiving area of the light receiving component 14, and a second through hole 165 corresponding to the light emitting area of the light emitting component 15. Similarly, the light shielding layer 17a defines the first through hole 174 corresponding to the light receiving area of the light receiving component 14, and a second through hole 175 corresponding to the light emitting area of the light emitting component 15. The first through hole 54 of the outer encapsulant 5 may align with the first through hole 174 of the light shielding layer 17a and the first through hole 164 of the coupling layer 16a, and the second through hole 55 of the outer encapsulant 5 may align with the second through hole 175 of the light shielding layer 17a and the second through hole 165 of the coupling layer 16a.

Then, a first optical lens 18 is disposed on the first encapsulant 3, and in the first through hole 54 of the outer encapsulant 5. Similarly, a second optical lens 19 is disposed on the second encapsulant 4, and in the second through hole 55 of the outer encapsulant 5. Then, a singulation process is conducted, thus forming the optical device 1a as shown in FIG. 2. Accordingly, a lateral surface 53 of the outer encapsulant 5 is substantially coplanar with a lateral surface 23 of the substrate 2.

Figure 16:
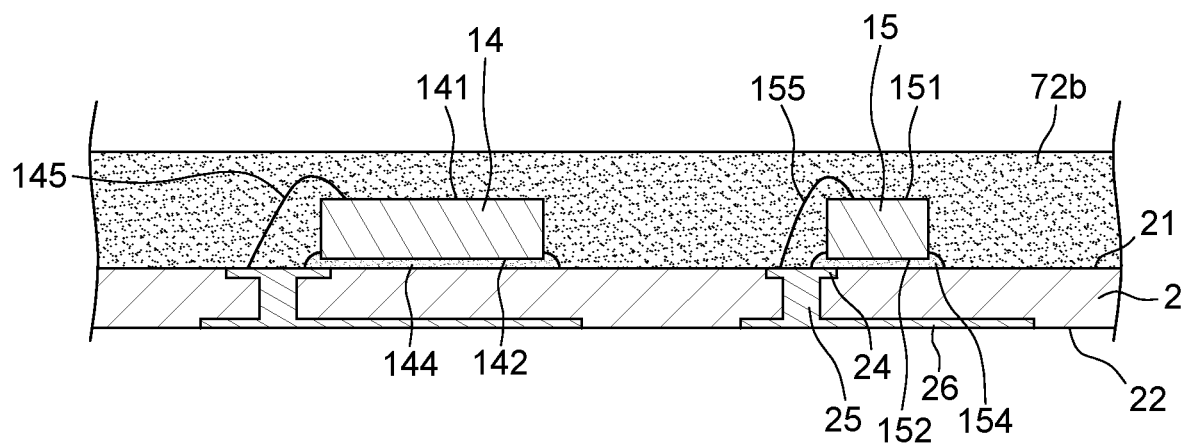
FIG. 16 illustrates one or more stages of an example of a method for manufacturing an optical device according to some embodiments of the present disclosure.

FIGS. 16 to 21 illustrate a method for manufacturing an optical device according to some embodiments of the present disclosure. In some embodiments, the method is for manufacturing an optical device such as the optical device 1b shown in FIG. 3. The initial stages of the illustrated process are the same as, or similar to, the stages illustrated in FIGS. 6 to 7. FIG. 16 depicts a stage subsequent to that depicted in FIG. 7.

Referring to FIG. 16, an encapsulant 72b is formed on the substrate 2 to cover the light receiving component 14 and the light emitting component 15. The encapsulant 72b may cover the entire first surface 21 of the substrate 2.

Figure 17:
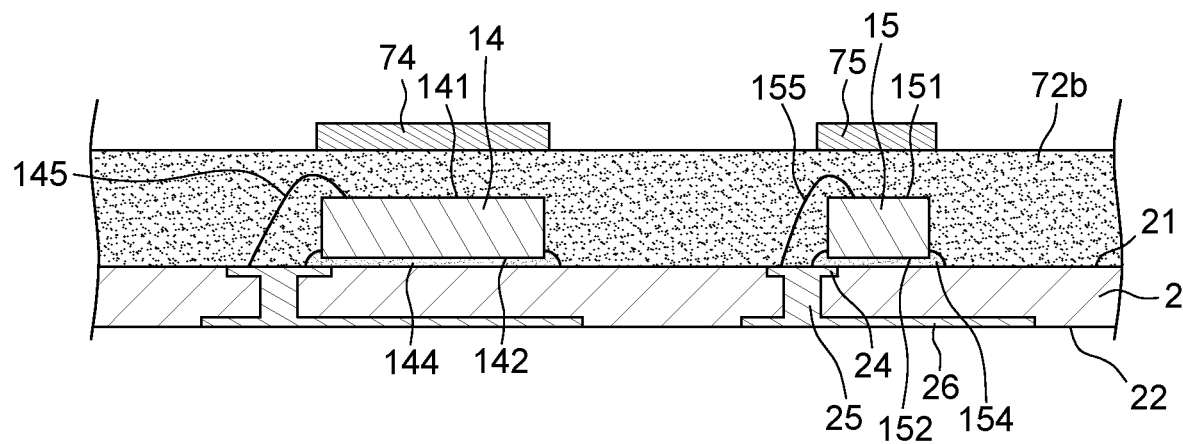
FIG. 17 illustrates one or more stages of an example of a method for manufacturing an optical device according to some embodiments of the present disclosure.

Referring to FIG. 17, a first spacer 74 is disposed on the encapsulant 72b and corresponding to a light receiving area of the light receiving component 14. Similarly, a second spacer 75 is disposed on the encapsulant 72b and corresponding to a light emitting area of the light emitting component 15.

Figure 18:
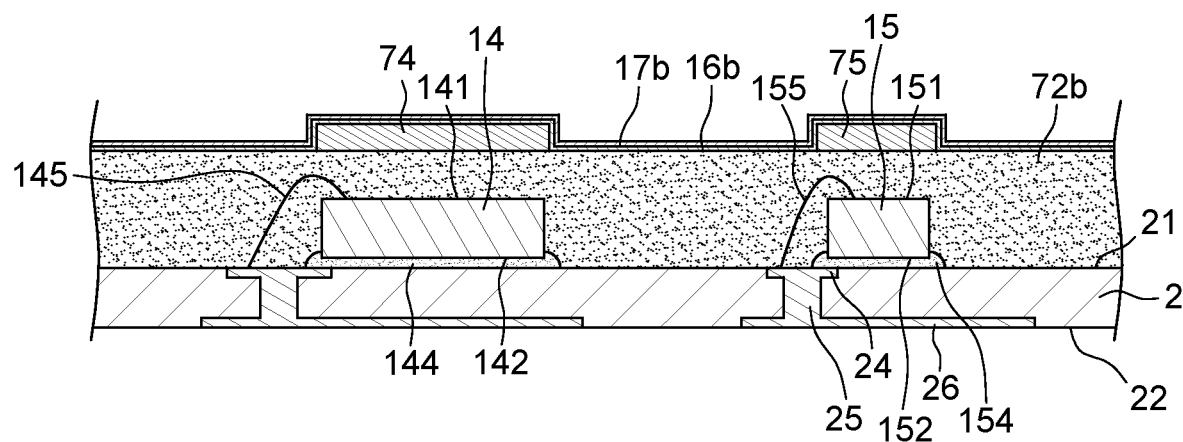
FIG. 18 illustrates one or more stages of an example of a method for manufacturing an optical device according to some embodiments of the present disclosure.

Referring to FIG. 18, a coupling layer 16b is formed to contact and cover a top surface of the encapsulant 72b, the first spacer 74 and the second spacer 75. Then, a shielding layer 17b is formed on and contacts the coupling layer 16b.

Figure 19:
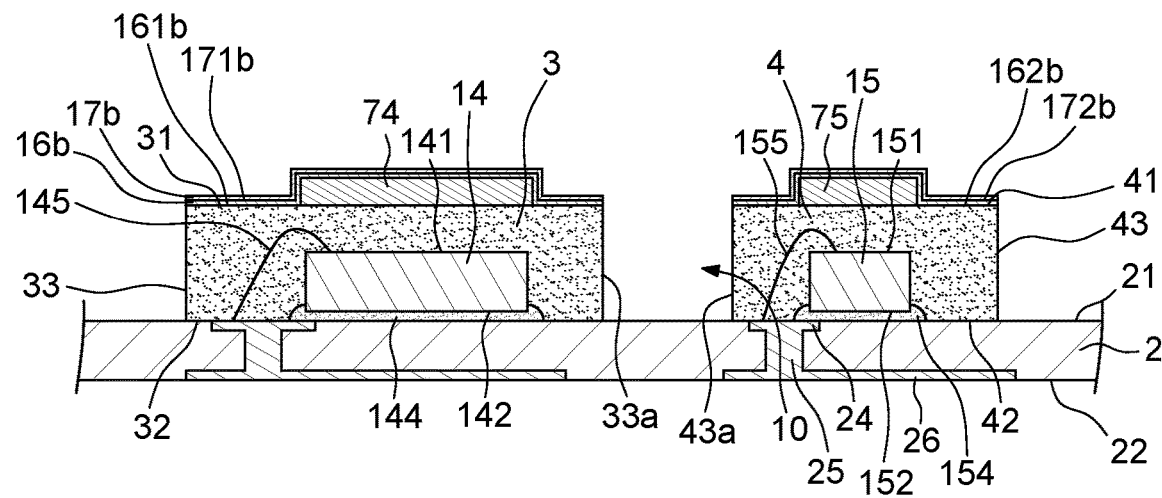
FIG. 19 illustrates one or more stages of an example of a method for manufacturing an optical device according to some embodiments of the present disclosure.

Referring to FIG. 19, the encapsulant 72b is cut and separated, thus forming a first encapsulant 3 to cover the light receiving component 14, and a second encapsulant 4 to cover the light emitting component 15. The first encapsulant 3 is disposed on the first surface 21 of the substrate 2 and encapsulates the light receiving component 14. The first encapsulant 3 has a first surface 31, a second surface 32 opposite to the first surface 31, and a lateral surface 33 extending between the first surface 31 and the second surface 32. The second surface 32 is disposed on and contacts the first surface 21 of the substrate 2. The second encapsulant 4 is disposed on the first surface 21 of the substrate 2 and encapsulates the light emitting component 15. The second encapsulant 4 has a first surface 41, a second surface 42 opposite to the first surface 41, and a lateral surface 43 extending between the first surface 41 and the second surface 42. The second surface 42 is disposed on and contacts the first surface 21 of the substrate 2.

A trench 10 is defined between the first encapsulant 3 and the second encapsulant 4. For example, an inner portion 33a of the lateral surface 33 of the first encapsulant 3 faces an inner portion 43a of the lateral surface 43 of the second encapsulant 4. The trench 10 is defined between the inner portion 33a of the lateral surface 33 of the first encapsulant 3 and inner portion 43a of the lateral surface 43 of the second encapsulant 4.

Correspondingly, the coupling layer 16b is also cut and separated to form a first portion 161b disposed on and contacting a top surface (e.g., the first surface 31) of the first encapsulant 3, and a second portion 162b disposed on and contacting a top surface (e.g., the first surface 41) of the second encapsulant 4. The light shielding layer 17b is also cut and separated to form a first portion 171b disposed on and contacting the first portion 161b of the coupling layer 16b, and a second portion 172b disposed on and contacting the second portion 162b of the coupling layer 16b.

Figure 20:
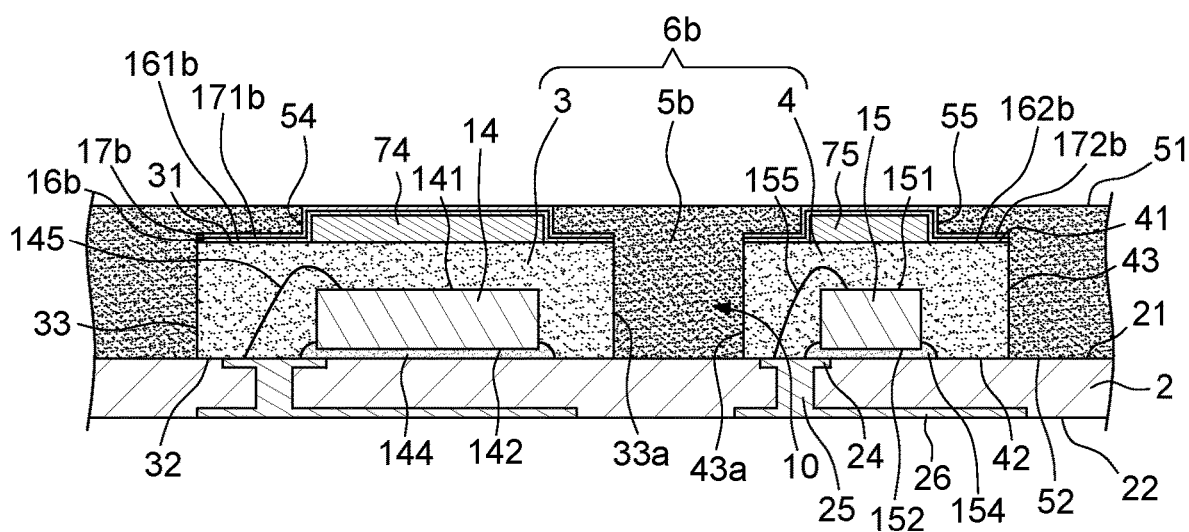
FIG. 20 illustrates one or more stages of an example of a method for manufacturing an optical device according to some embodiments of the present disclosure.

Referring to FIG. 20, an outer encapsulant 5b is formed to cover the coupling layer 16b, the light shielding layer 17b, the first encapsulant 3 and the second encapsulant 4. As shown in FIG. 20, the outer encapsulant 5b is disposed on and contacts the light shielding layer 17b, the lateral surface 33 of the first encapsulant 3 and the lateral surface 43 of the second encapsulant 4. The outer encapsulant 5b is further disposed in the trench 10 defined between the inner portion 33a of the lateral surface 33 of the first encapsulant 3 and inner portion 43a of the lateral surface 43 of the second encapsulant 4. The outer encapsulant 5b defines a first through hole 54 to accommodate the first spacer 74, and a second through hole 55 to accommodate the second spacer 75. The first through hole 54 corresponds to the light receiving area of the light receiving component 14, and the second through hole 55 corresponds to the light emitting area of the light emitting component 15. Hence, an encapsulant 6b is formed and includes the first encapsulant 3, the second encapsulant 4 and the outer encapsulant 5b.

Figure 21:
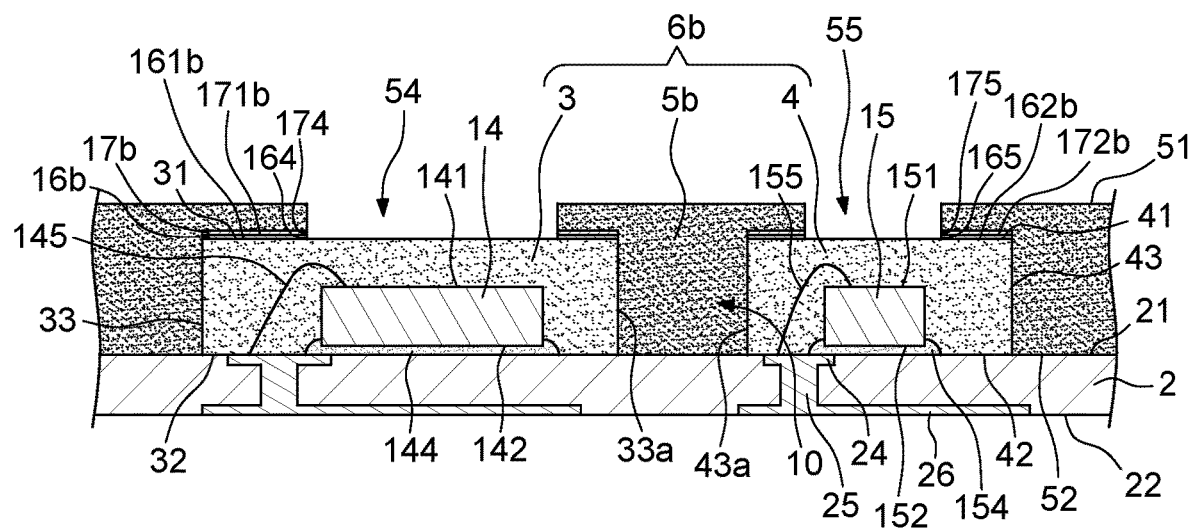
FIG. 21 illustrates one or more stages of an example of a method for manufacturing an optical device according to some embodiments of the present disclosure.

Referring to FIG. 21, the first spacer 74 is removed. A portion of the coupling layer 16b and a portion of the light shielding layer 17b on the first spacer 74 are correspondingly removed to form a first through hole 164 of the coupling layer 16b and a first through hole 174 of the light shielding layer 17b. Similarly, the second spacer 75 is removed, and a portion of the coupling layer 16b and a portion of the light shielding layer 17b on the second spacer 75 are correspondingly removed to form a second through hole 165 of the coupling layer 16b and a second through hole 175 of the light shielding layer 17b. That is, the coupling layer 16b defines the first through hole 164 corresponding to the light receiving area of the light receiving component 14, and a second through hole 165 corresponding to the light emitting area of the light emitting component 15. Similarly, the light shielding layer 17b defines the first through hole 174 corresponding to the light receiving area of the light receiving component 14, and a second through hole 175 corresponding to the light emitting area of the light emitting component 15. The first through hole 54 of the outer encapsulant 5b may align with the first through hole 174 of the light shielding layer 17b and the first through hole 164 of the coupling layer 16b, and the second through hole 55 of the outer encapsulant 5b may align with the second through hole 175 of the light shielding layer 17b and the second through hole 165 of the coupling layer 16b.

Then, a first optical lens 18 is disposed on the first encapsulant 3, and in the first through hole 164 of the coupling layer 16b, the first through hole 174 of the light shielding layer 17b and the first through hole 54 of the outer encapsulant 5b. Similarly, a second optical lens 19 is disposed on the second encapsulant 4, and in the second through hole 165 of the coupling layer 16b, the second through hole 175 of the light shielding layer 17b and the second through hole 55 of the outer encapsulant 5b. Then, a singulation process is conducted, thus forming the optical device 1b as shown in FIG. 3. Accordingly, a lateral surface 53 of the outer encapsulant 5b is substantially coplanar with a lateral surface 23 of the substrate 2.

Figure 22:
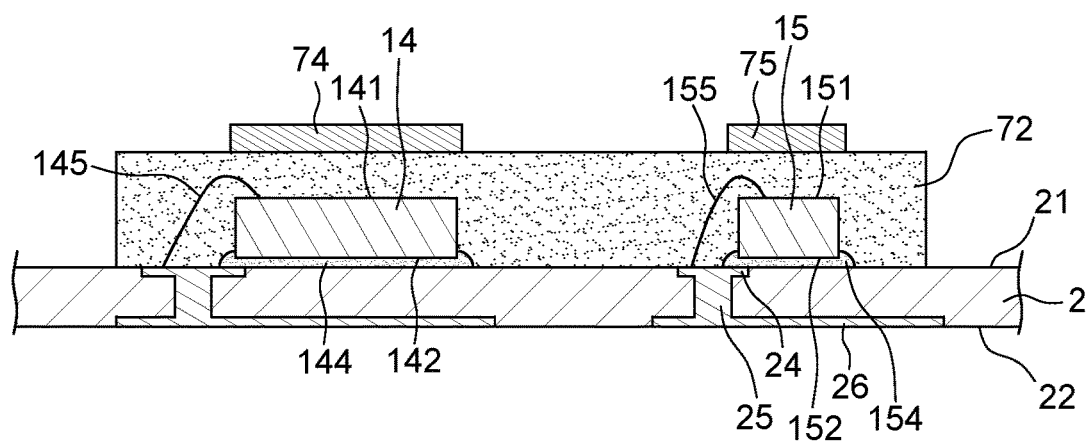
FIG. 22 illustrates one or more stages of an example of a method for manufacturing an optical device according to some embodiments of the present disclosure.
Figure 23:
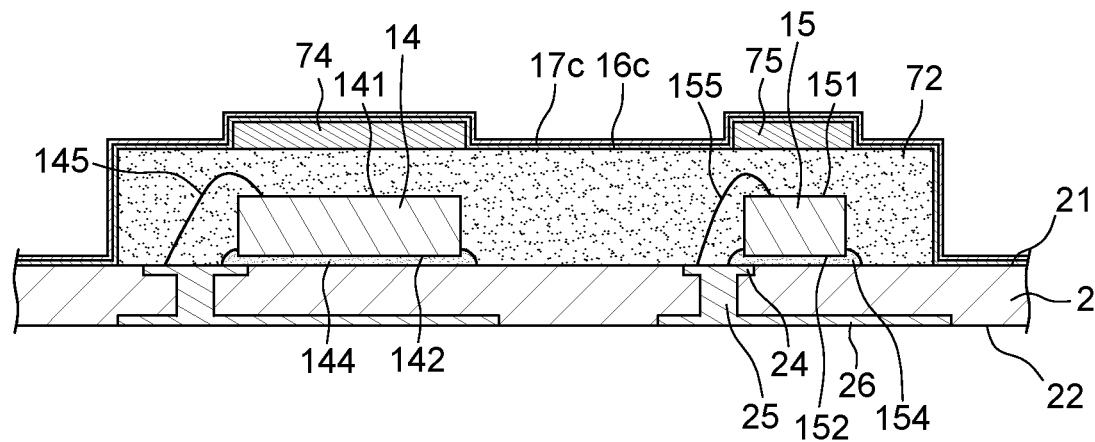
FIG. 23 illustrates one or more stages of an example of a method for manufacturing an optical device according to some embodiments of the present disclosure.
Figure 24:
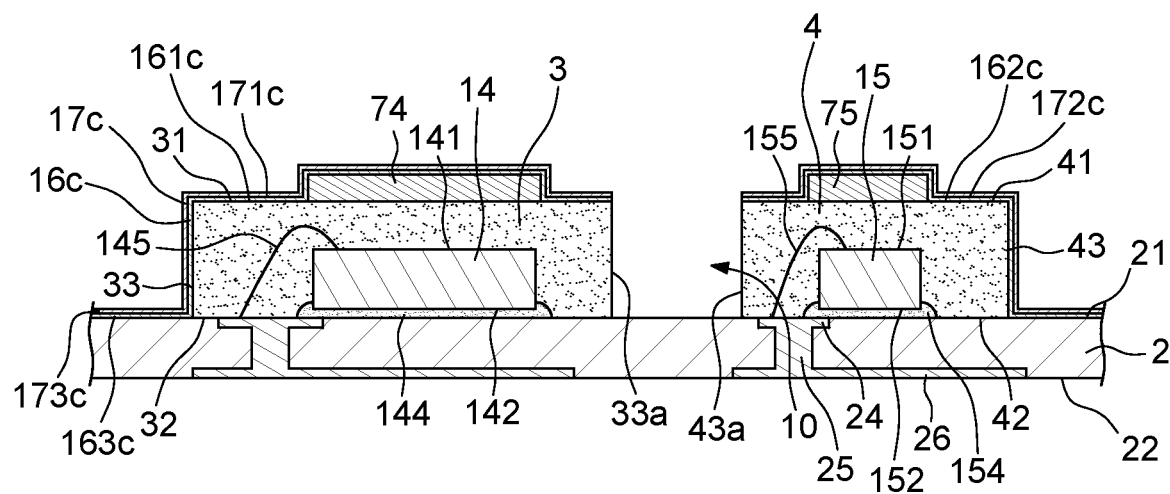
FIG. 24 illustrates one or more stages of an example of a method for manufacturing an optical device according to some embodiments of the present disclosure.

FIGS. 22 to 24 illustrate a method for manufacturing an optical device according to some embodiments of the present disclosure. In some embodiments, the method is for manufacturing an optical device such as the optical device 1c shown in FIG. 4. The initial stages of the illustrated process are the same as, or similar to, the stages illustrated in FIGS. 6 to 8. FIG. 16 depicts a stage subsequent to that depicted in FIG. 8.

Referring to FIG. 22, a first spacer 74 is disposed on the encapsulant 72 and corresponding to a light receiving area of the light receiving component 14. Similarly, a second spacer 75 is disposed on the encapsulant 72 and corresponding to a light emitting area of the light emitting component 15.

Referring to FIG. 23, a coupling layer 16c is formed to cover a top surface and a lateral surface of the encapsulant 72, the first spacer 74 and the second spacer 75, and a portion of the first surface 21 of the substrate 2. Then, a shielding layer 17b is formed on and contacts the coupling layer 16b.

Referring to FIG. 24, the encapsulant 72 is cut and separated, thus forming a first encapsulant 3 to cover the light receiving component 14, a second encapsulant 4 to cover the light emitting component 15, and a trench 10 defined between the first encapsulant 3 and the second encapsulant 4. The first encapsulant 3 is disposed on the first surface 21 of the substrate 2 and encapsulates the light receiving component 14. The first encapsulant 3 has a first surface 31, a second surface 32 opposite to the first surface 31, and a lateral surface 33 extending between the first surface 31 and the second surface 32. The second surface 32 is disposed on and contacts the first surface 21 of the substrate 2. The second encapsulant 4 is disposed on the first surface 21 of the substrate 2 and encapsulates the light emitting component 15. The second encapsulant 4 has a first surface 41, a second surface 42 opposite to the first surface 41, and a lateral surface 43 extending between the first surface 41 and the second surface 42. The second surface 42 is disposed on and contacts the first surface 21 of the substrate 2.

Correspondingly, the coupling layer 16c is also cut and separated to form a first portion 161c disposed on and contacting a top surface (e.g., the first surface 31) of the first encapsulant 3, and a second portion 162c disposed on and contacting a top surface (e.g., the first surface 41) of the second encapsulant 4. The first portion 161c of the coupling layer 16c is further disposed on and contacts the lateral surface 33 of the first encapsulant 3, except for the inner portion 33a of the lateral surface 33. Similarly, the second portion 162c of the coupling layer 16c is further disposed on and contacts the lateral surface 43 of the second encapsulant 4, except for the inner portion 43a of the lateral surface 43. The light shielding layer 17c is also cut and separated to form a first portion 171c disposed on and contacting the first portion 161c of the coupling layer 16c, and a second portion 172c disposed on and contacting the second portion 162c of the coupling layer 16c. Accordingly, the first portion 171c of the light shielding layer 17c is further disposed on the lateral surface 33 of the first encapsulant 3, except for the inner portion 33a of the lateral surface 33. Similarly, the second portion 172c of the light shielding layer 17c is further disposed on the lateral surface 43 of the second encapsulant 4, except for the inner portion 43a of the lateral surface 43.

The coupling layer 16c further includes a third portion 163c disposed on the first surface 21 of the substrate 2 and connects the first portion 161c and the second portion 162c. Similarly, the light shielding layer 17c further includes a third portion 173c disposed on the third portion 163c of the coupling layer 16c, and connects the first portion 171c and the second portion 172c.

The stages subsequent to that shown in FIG. 24 of the illustrated process are similar to the stages illustrated in FIGS. 20 to 21, thus forming the optical device 1c shown in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical device, comprising:
    a substrate;
    a light receiving component disposed on the substrate;
    an encapsulant covering the light receiving component;
    a coupling layer disposed on at least a portion of the encapsulant, wherein the coupling layer is formed of a coupling agent, and the coupling agent is selected from a group consisting of silane coupling agent, titanate coupling agent, aluminate coupling agent, phosphate coupling agent, borate coupling agent, chrome complex coupling agent, bimetal coupling agent, aliphatic acid coupling agent, aliphatic alcohol coupling agent and ester coupling agent; and
    a light shielding layer disposed on the coupling layer.

2. The optical device of claim 1, wherein the light shielding layer defines a through hole corresponding to a light receiving area of the light receiving component.

3. The optical device of claim 1, wherein the light shielding layer is a metal layer.

4. The optical device of claim 1, wherein the coupling layer is disposed on and contacts a top surface and a lateral surface of the encapsulant, and the light shielding layer is disposed on and contacts the coupling layer.

5. The optical device of claim 1, wherein the encapsulant includes a first encapsulant and an outer encapsulant, the first encapsulant covers the light receiving component, the outer encapsulant covers the first encapsulant, and the coupling layer is disposed on the outer encapsulant.

6. The optical device of claim 5, wherein the coupling layer is disposed on and contacts a top surface of the outer encapsulant, and the light shielding layer is disposed on and contacts the coupling layer.

7. The optical device of claim 5, wherein the first encapsulant is transparent or translucent, and the outer encapsulant is opaque.

8. The optical device of claim 5, wherein the outer encapsulant is disposed on and contacts a top surface and a lateral surface of the first encapsulant.

9. The optical device of claim 1, further comprising:
    a light emitting component disposed on the substrate and adjacent to the light receiving component; and
    wherein the encapsulant includes a first encapsulant and a second encapsulant, the first encapsulant covers the light receiving component, and the second encapsulant covers the light emitting component.

10. The optical device of claim 9, wherein a first portion of the coupling layer is disposed on and contacts a top surface and a lateral surface of the first encapsulant, a second portion of the coupling layer is disposed on and contacts a top surface and a lateral surface of the second encapsulant; a first portion of the light shielding layer is disposed on and contacts the first portion of the coupling layer, and a second portion of the light shielding layer is disposed on and contacts the second portion of the coupling layer.

11. The optical device of claim 9, further comprising an outer encapsulant covering the first encapsulant and the second encapsulant.

12. The optical device of claim 11, wherein the coupling layer is disposed on and contacts a top surface of the outer encapsulant, and the light shielding layer is disposed on and contacts the coupling layer.

13. The optical device of claim 11, wherein the outer encapsulant defines a first through hole corresponding to a light receiving area of the light receiving component, and a second through hole corresponding to a light emitting area of the light emitting component.

14. The optical device of claim 11, wherein a trench is defined between the first encapsulant and the second encapsulant, and the outer encapsulant is further disposed in the trench between the first encapsulant and the second encapsulant.

15. An optical device, comprising:
a substrate;
a light receiving component disposed on the substrate;
a first encapsulant covering the light receiving component;
a light shielding layer disposed on the first encapsulant, wherein the light shielding layer defines a through hole corresponding to a light receiving area of the light receiving component; and
an outer encapsulant covering the light shielding layer.

16. The optical device of claim 15, wherein the light shielding layer is a metal layer.

17. The optical device of claim 15, further comprising a coupling layer disposed on and contacts a top surface of the first encapsulant, and the light shielding layer is disposed on and contacts the coupling layer.

18. The optical device of claim 15, further comprising:
a light emitting component disposed on the substrate and adjacent to the light receiving component; and
a second encapsulant covering the light emitting component.

19. The optical device of claim 18, wherein a first portion of the coupling layer is disposed on and contacts a top surface of the first encapsulant, a second portion of the coupling layer is disposed on and contacts a top surface of the second encapsulant; a first portion of the light shielding layer is disposed on and contacts the first portion of the coupling layer, and a second portion of the light shielding layer is disposed on and contacts the second portion of the coupling layer.

20. A method for manufacturing an optical device, comprising:
(a) providing a substrate;
(b) disposing a light receiving component on the substrate;
(c) forming an encapsulant to cover the light receiving component;
(c1) disposing a spacer on the encapsulant and corresponding to a light receiving area of the light receiving component;
(d) coating a coupling agent on a surface of the encapsulant to form a coupling layer;
(e) forming a light shielding layer on the coupling layer; and
(f) removing the spacer, such that the light shielding layer defines a through hole corresponding to the light receiving area of the light receiving component.

21. The method of claim 20, wherein operation (b) further comprises disposing a light emitting component on the substrate and adjacent to the light receiving component; operation (c) comprises forming a first encapsulant to cover the light receiving component, a second encapsulant to cover the light emitting component, and an outer encapsulant to cover the first encapsulant and the second encapsulant; and operation (d) comprises coating the coupling agent on a top surface of the outer encapsulant to form the coupling layer.

* * * * *